US006972586B2

(12) United States Patent
Sawamori

(10) Patent No.: US 6,972,586 B2
(45) Date of Patent: Dec. 6, 2005

(54) PANEL INSPECTION APPARATUS

(75) Inventor: Akira Sawamori, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 406 days.

(21) Appl. No.: 10/014,369

(22) Filed: Dec. 14, 2001

(65) Prior Publication Data

US 2003/0027479 A1 Feb. 6, 2003

(30) Foreign Application Priority Data

Jul. 31, 2001 (JP) ............................ 2001-231195

(51) Int. Cl.[7] ........................ G01R 31/00; G01R 31/02
(52) U.S. Cl. .................... 324/770; 324/158.1; 324/755
(58) Field of Search ................................ 324/750–770; 445/63

(56) References Cited

U.S. PATENT DOCUMENTS 5,801,542 A * 9/1998 Kajiwara et al. ........... 324/755
6,577,145 B2 * 6/2003 Okuno et al. ............... 324/754

FOREIGN PATENT DOCUMENTS

JP 10-153631 * 9/1998 .......... G01R 31/00

* cited by examiner

*Primary Examiner*—Vinh Nguyen
*Assistant Examiner*—Emily Y Chan
(74) *Attorney, Agent, or Firm*—Staas & Halsey LLP

(57) ABSTRACT

A panel inspection apparatus that contacts a PDP electrode, which is arranged on a display panel, with high accuracy. An inspection unit includes a pressurizing lever for pressing an inspection electrode, which is fastened to a fastening block, against the PDP electrode. The pressurizing levers move away from the display panel without altering the position of the fastening block.

15 Claims, 10 Drawing Sheets

PANEL INSPECTION APPARATUS

BACKGROUND OF THE INVENTION

The present invention relates to a panel inspection apparatus, and more particularly, to a panel display inspection apparatus that inspects panels of flat displays such as a plasma display panel.

A display panel includes display electrode terminal rows and display elements. In the prior art, the display electrode terminal rows and the illumination of every display element are inspected before attaching the display panel to a display frame. During the inspection, an inspection electrode, through which a drive circuit provides an inspection signal, contacts an electrode of the display panel. To improve the accuracy of the inspection, the inspection electrode must accurately contact the electrode of the display panel.

FIG. 1 is a schematic view showing a prior art panel inspection apparatus 81. A display panel 71 is a glass panel, such as a plasma display panel (PDP). The display panel 71 includes a plurality of PDP electrodes 72. The PDP electrodes 72 each have a predetermined width and are spaced equally from each other along an edge of the display panel 71. PDP electrode groups 72*a*, 72*b*, 72*c* are each formed by a predetermined number of the PDP electrodes 72. The PDP electrode groups 72*a*–72*c* are equally spaced.

The panel inspection apparatus 81 includes a plurality of inspection units 82*a*, 82*b*, 82*c*, which respectively correspond to the PDP electrode groups 72*a*, 72*b*, 72*c*. The inspection units 82*a*, 82*b*, 82*c* respectively have inspection electrodes 83*a*, 83*b*, 83*c*, which contact the associated PDP electrode groups 72*a*, 72*b*, 72*c*.

The inspection units 82*a*–82*c* each include a pressurizing mechanism that includes an upper pressurizing lever 84 and a lower pressurizing lever 85. Elastic bodies 86 are attached to the opposing surfaces (pressurizing surfaces) of the pressurizing levers 84, 85. When each pair of the pressurizing levers 84, 85 hold the display panel 71 and the associated inspection electrodes 83*a*–83*c* in between, the inspection electrodes 83*a*–83*c* contact the PDP electrode groups 72*a*–72*c*.

FIG. 2 shows the inspection electrode 83*a* of the inspection unit 82*a*. The inspection electrode 83*a* is electrically connected to the PDP electrode group 72*a*. The panel inspection apparatus 81 includes a drive circuit 87, which is located below the display panel 71 and provides an inspection electric signal to the display panel 71. The drive circuit 87 has a printed circuit 88, which is formed from a film printed circuit, to electrically connect the inspection electrode 83*a* and the PDP electrode group 72*a*.

As shown in FIG. 2, the pressurizing levers 84, 85 clamp the printed circuit 88 between the display panel 71 and the inspection electrode 83*a*. In this state, the drive circuit 87 provides the electrode group 72*a* with the electric signal to perform a predetermined inspection, such as inspecting the illumination of the panel.

One or two alignment marks are inscribed on the display panel and are used to align the inspection electrodes 83*a*–83*c* with the corresponding PDP electrode groups 72*a*–72*c*. In other words, the inspection units 82*a*–82*c* are positioned in accordance with the alignment marks so that the inspection electrodes 83*a*–83*c* contact the PDP electrode groups 72*a*–72*c*.

Nowadays, large-size display panels are produced. As a result, the panel is apt to bend when heating the panel to form the electrodes. The bending of a panel may cause the pitch between electrodes to differ significantly from the intended value. Differentiation of the electrode pitch increases at PDP electrodes 72 located farther from an alignment mark. This makes the alignment of the PDP electrodes 72*a*–72*c* and the inspection electrodes 83*a*–83*c* difficult.

Referring to FIG. 1, in the prior art panel inspection apparatus 81, the pressurizing levers 84, 85 are movable in a direction intersecting the panel 71 (the two directions indicated by an arrow in FIG. 1) to decrease the bending of the panel.

The bending of the panel 71 displaces the PDP electrode groups 72*a*–72*c*. Thus, a relatively large force is necessary to correct the bending of the panel 71 so that all of the PDP electrode groups 72*a*–72*c* uniformly contact the inspection electrodes 83*a*–83*c*. However, the application of a large force to the panel 71 shortens the life of the inspection electrodes 83*a*–83*c* and decreases the accuracy of the panel inspection.

Further, when using the prior art panel inspection apparatus 81 to inspect a panel in which the pitch between the PDP electrode groups 72*a*–72*c* differ, the position of each of the inspection units 82*a*–82*c* must be changed. However, the position adjustment of the inspection units 82*a*–82*c* is difficult. Thus, it takes a long time to change the position of the inspection units 82*a*–82*c* when inspecting panels having different sizes.

Additionally, since the printed circuit 88, which, for example, electrically connects the inspection electrode 83*a* and the PDP electrode group 72*a*, is clamped between the pressurizing levers 84, 85, the printed circuit 88 is apt to break.

BRIEF SUMMARY OF THE INVENTION

It is an object of the present invention to provide a panel inspection apparatus having inspection electrodes that contact electrodes of a display panel with high accuracy.

To achieve the above object, the present invention provides a panel inspection apparatus for inspecting a display panel. The display panel has a side on which a panel electrode group is arranged. The panel inspection apparatus includes an inspection unit having an inspection electrode. The inspection unit causes the inspection electrode to contact the panel electrode group and moves in a direction perpendicular to the side of the display panel. A pressurizing mechanism presses the inspection electrode against the panel electrode group. The pressurizing mechanism moves independently in a direction perpendicular to the side of the display panel in a state in which the inspection unit is arranged at a position where the inspection electrode contacts the panel electrode group.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

A panel inspection apparatus 11 according to a preferred embodiment of the present invention will now be discussed.

Figure 1:
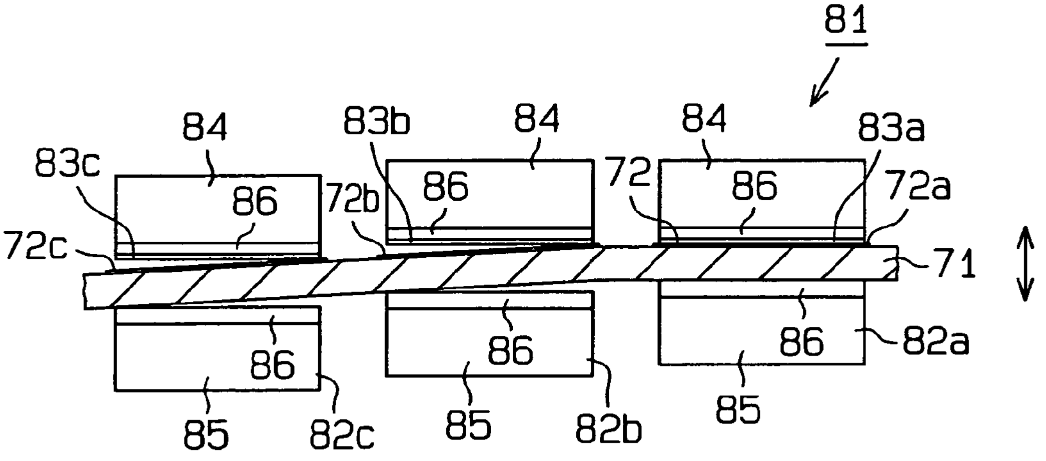
Fig.1 (Prior Art)
FIG. 1 is a cross-sectional view showing a prior art panel inspection apparatus.
Figure 2:
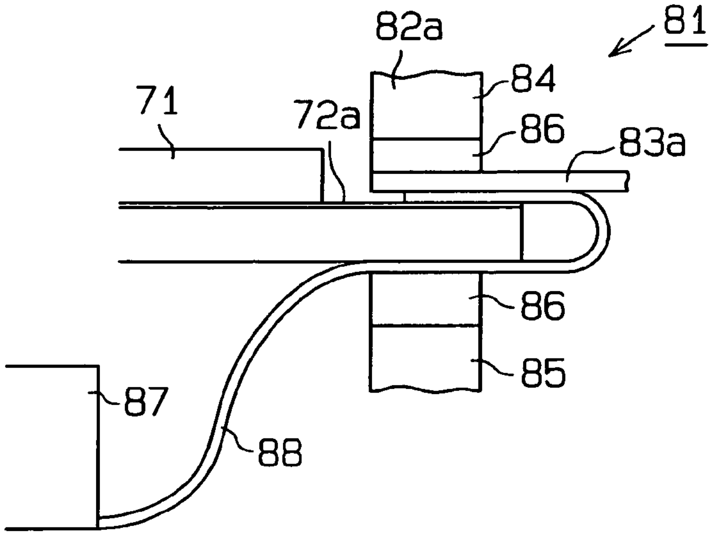
Fig.2 (Prior Art)
FIG. 2 is a side view showing a prior art inspection unit.
Figure 3:
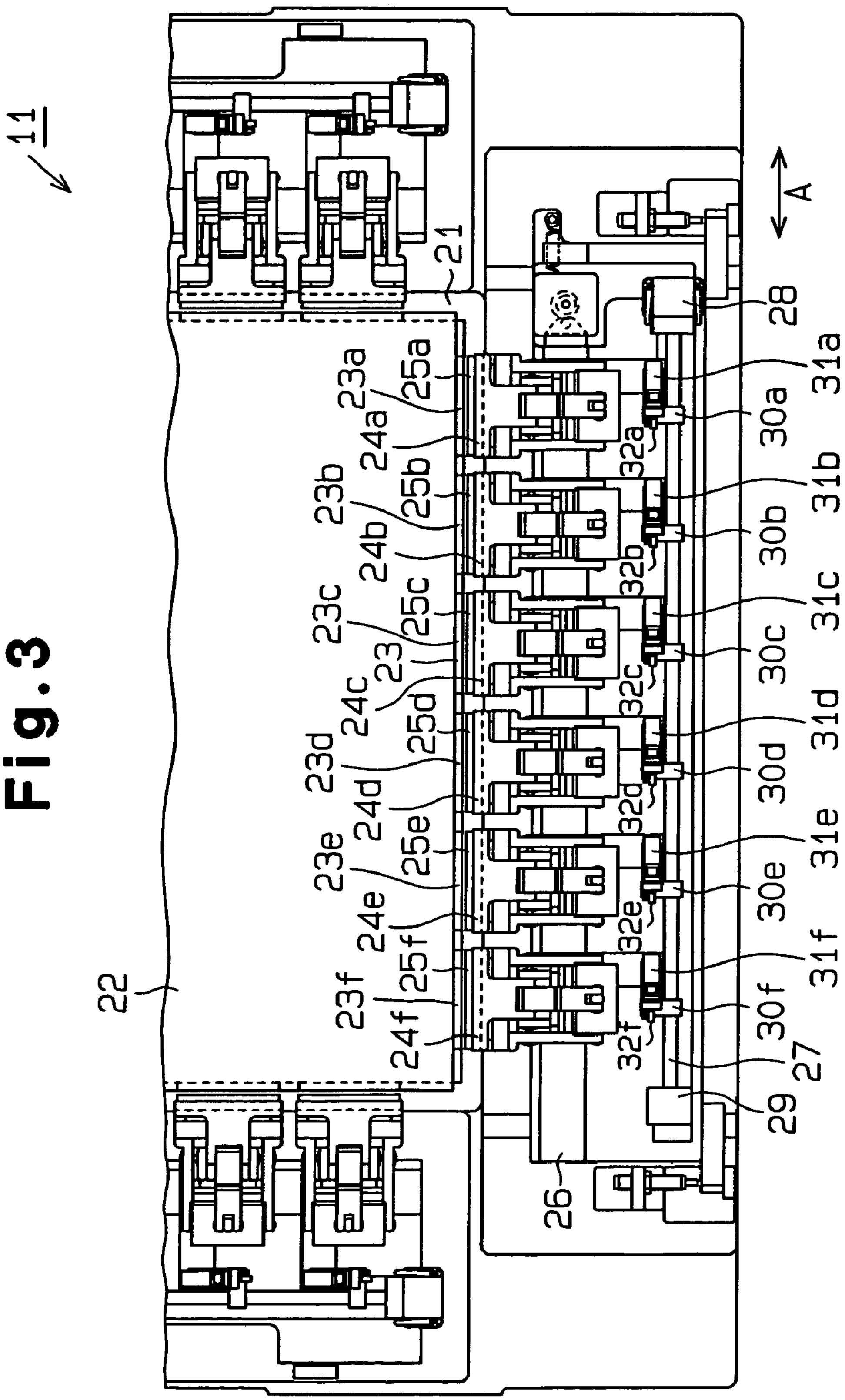
FIG. 3 is a plan view showing a panel inspection apparatus according to a preferred embodiment of the present invention.

Referring to FIG. 3, the panel inspection apparatus 11 includes a stage 21. A display panel 22, such as a plasma display panel, is inspected on the stage 21. The display panel 22 is fixed on the stage 21 at a predetermined position by a fastener (not shown), such as a suction mechanism.

A plurality of PDP electrodes 23 are formed on each side edge of the display panel 22. The PDP electrodes 23 are equally spaced along the sides of the display panel and each have a predetermined length. PDP electrode groups 23*a*, 23*b*, 23*c*, 23*d*, 23*e*, and 23*f* are each formed by a predetermined number of the PDP electrodes 23. The plurality of (six) PDP electrode groups 23*a*–23*f* are spaced from one another by a predetermined interval (pitch). The display panel 22 will now be described focusing on one side of the display panel 22.

The panel inspection apparatus 11 includes a plurality of (six) inspection units 24*a*, 24*b*, 24*c*, 24*d*, 24*e*, and 24*f* relatively corresponding to the PDP electrode groups 23*a*, 23*b*, 23*c*, 23*d*, 23*e*, and 23*f*. The inspection units 24*a*, 24*b*, 24*c*, 24*d*, 24*e*, and 24*f* respectively include inspection electrodes 25*a*, 25*b*, 25*c*, 25*d*, 25*e*, and 25*f*. The preferred inspection electrodes 25*a*–25*f* are flexible printed circuits (FPC). An inspector uses a plurality of alignment marks (not shown), which are inscribed on the display panel 22, to position the inspection units 24*a*–24*f* so that the inspection electrodes 25*a*–25*f* are aligned with the associated PDP electrode groups 23*a*–23*f*. The inspection units 24*a*–24*f* each have a pressurizing mechanism (not shown), which causes contact between the inspection electrodes 25*a*–25*f* and the PDP electrode groups 23*a*–23*f*. A drive circuit 43 (FIG. 9) outputs an inspection signal, which is provided to the display panel 22 via the inspection electrodes 25*a*–25*f* and the PDP electrode groups 23*a*–23*f*.

The panel inspection apparatus 11 has a first rail 26 extending along the side of the display panel 22. The inspection units 24*a*–24*f* are movable in two directions (the two directions indicated by arrow A in FIG. 3) along the first rail 26.

Catch blocks 28, 29 support a jig 27 parallel to the first rail 26. The jig 27 is a positioning shaft having a predetermined length and is removable from the catch blocks 28, 29. Equally spaced connection blocks 30*a*–30*f*, which function as positioning devices, are attached to the jig 27. More specifically, the six connection blocks 30*a*–30*f*, which are separated from one another by a predetermined pitch, are attached to the jig 27 in correspondence with the six PDP electrode groups 23*a*–23*f*. In the preferred embodiment, the number of the connection blocks 30*a*–30*f* is the same as the number of PDP electrode groups 23*a*–23*f* formed on one side of the display panel 22.

Catch clips 31*a*, 31*b*, 31*c*, 31*d*, 31*e*, and 31*f* connect the inspection units 24*a*, 24*b*, 24*c*, 24*d*, 24*e*, and 24*f* and the connection blocks 30*a*, 30*b*, 30*c*, 30*d*, 30*e*, and 30*f*, respectively. The inspection units 24*a*–24*f* are fixed to the jig 27 by means of the catch clips 31*a*–31*f* and the connection blocks 30*a*–30*f*.

The connection blocks 30*a*, 30*b*, 30*c*, 30*d*, 30*e*, and 30*f* respectively have fine adjustment screws 32*a*, 32*b*, 32*c*, 32*d*, 32*e*, and 32*f*, which serve as adjusting elements. The fine adjustment screws 32*a*–32*f* move the catch clips 31*a*–31*f* to adjust the positions of the inspection units 24*a*–24*f* along the side of the display panel 22. This aligns the inspection units 24*a*–24*f* with the corresponding PDP electrode groups 23*a*–23*f*.

Figure 4:
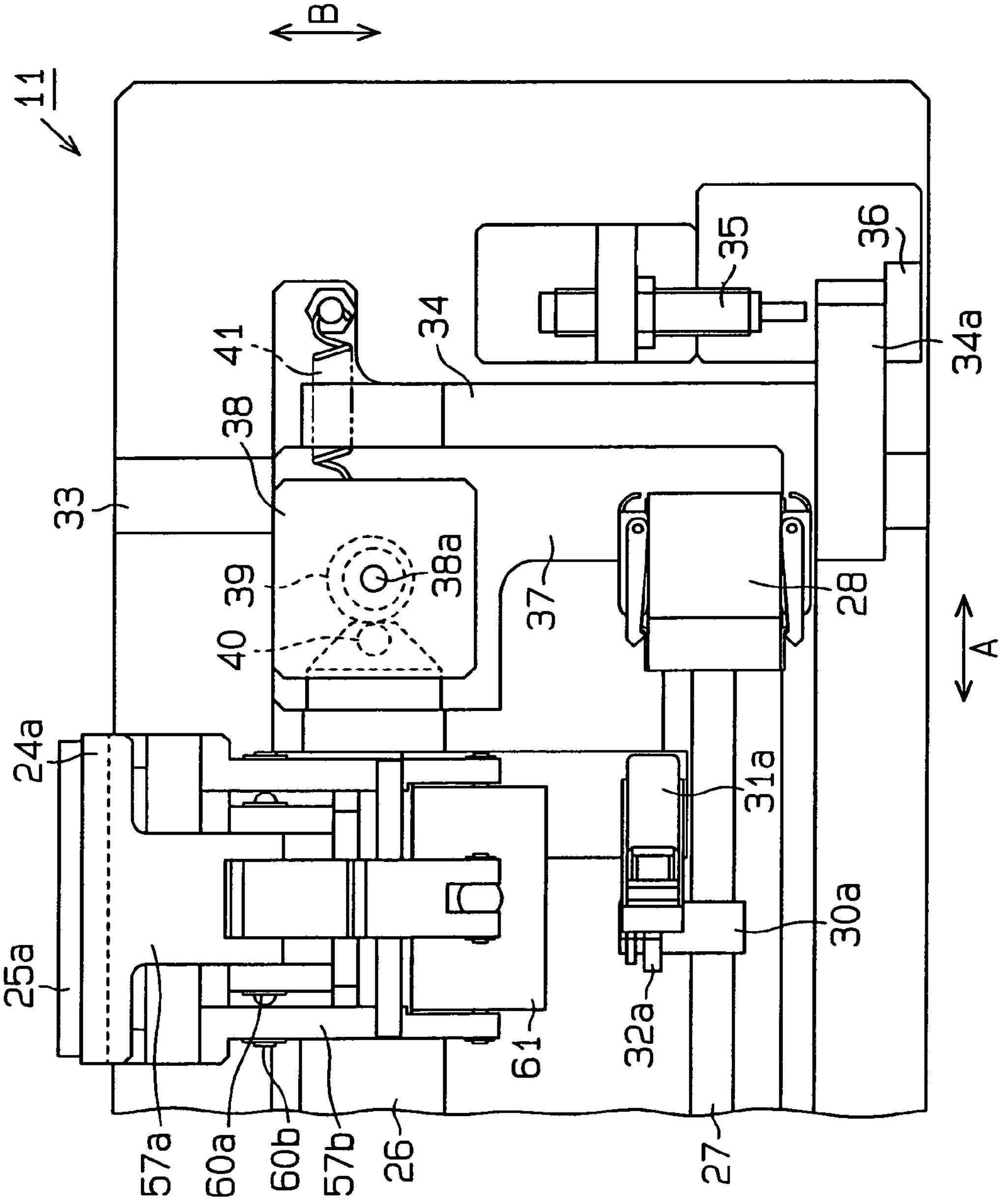
FIG. 4 is an enlarged view showing the embodiment of FIG. 3 in the vicinity of one end of a jig.

FIG. 4 is an enlarged view of the catch block 28 and the inspection unit 24*a*. The panel inspection apparatus 11 has a plurality of second rails 33, which are perpendicular to the first rail 26. The second rails 33 support a base 34 so that the base 34 is movable in the two directions indicated by arrow B. The base 34 cannot be moved along the first rail 26. The base 34 has a projection 34*a*, which comes into contact with an absorber 35 and a stopper 36 and restricts the moving range of the base 34. When the base 34 approaches the display panel 22, the absorber 35 controls the velocity of the base 34.

The base 34 supports a slide block 37 so that the slide block 37 is movable in the directions indicated by arrow A. The slide block 37 is attached to the catch block 28. Thus, the catch block 28 connects the jig 27 and the slide block 37 to each other.

The slide block 37 includes an alignment motor 38. The alignment motor 38 has a rotary shaft 38*a*. An eccentric cam 39 is coupled to the rotary shaft 38*a*. The eccentric cam 39 contacts a cam follower 40, which is provided in the slide block 37. A spring 41 is arranged between the base 34 and the slide block 37.

When the rotary shaft 38*a* rotates, the cam follower 40 moves to the left in one of the directions indicated by arrow A. This moves the slide block 37 and the jig 27 to the left. As a result, the inspection units 24*a*–24*f* are each moved to the left by the same distance along the first rail 26.

Further rotation of the rotary shaft 38*a* moves the cam follower 40 along the eccentric cam 39 to the right in the other direction indicated by arrow A. As a result, the inspection units 24*a*–24*f* are each moved to the right by the same distance along the first rail 26.

In this manner, the inspection units 24*a*–24*f* move along the first rail 26 in accordance with the rotational position of the eccentric cam 39. When the inspection units 24*a*–24*f* move, the pitch between the inspection units 24*a*–24*f* remains the same.

The inspection units 24*a*–24*f* are moved by the same distance. Thus, the inspection units 24*a*–24*f* are easily positioned even when the display panel 22 is displaced.

The alignment of the PDP electrode groups 23*a*–23*f* and the inspection units 24*a*–24*f* when inspecting display panels 22, 22*a*, 22*b*, which have different sizes, will now be described with reference to FIGS. 5 to 7.

Figure 5:
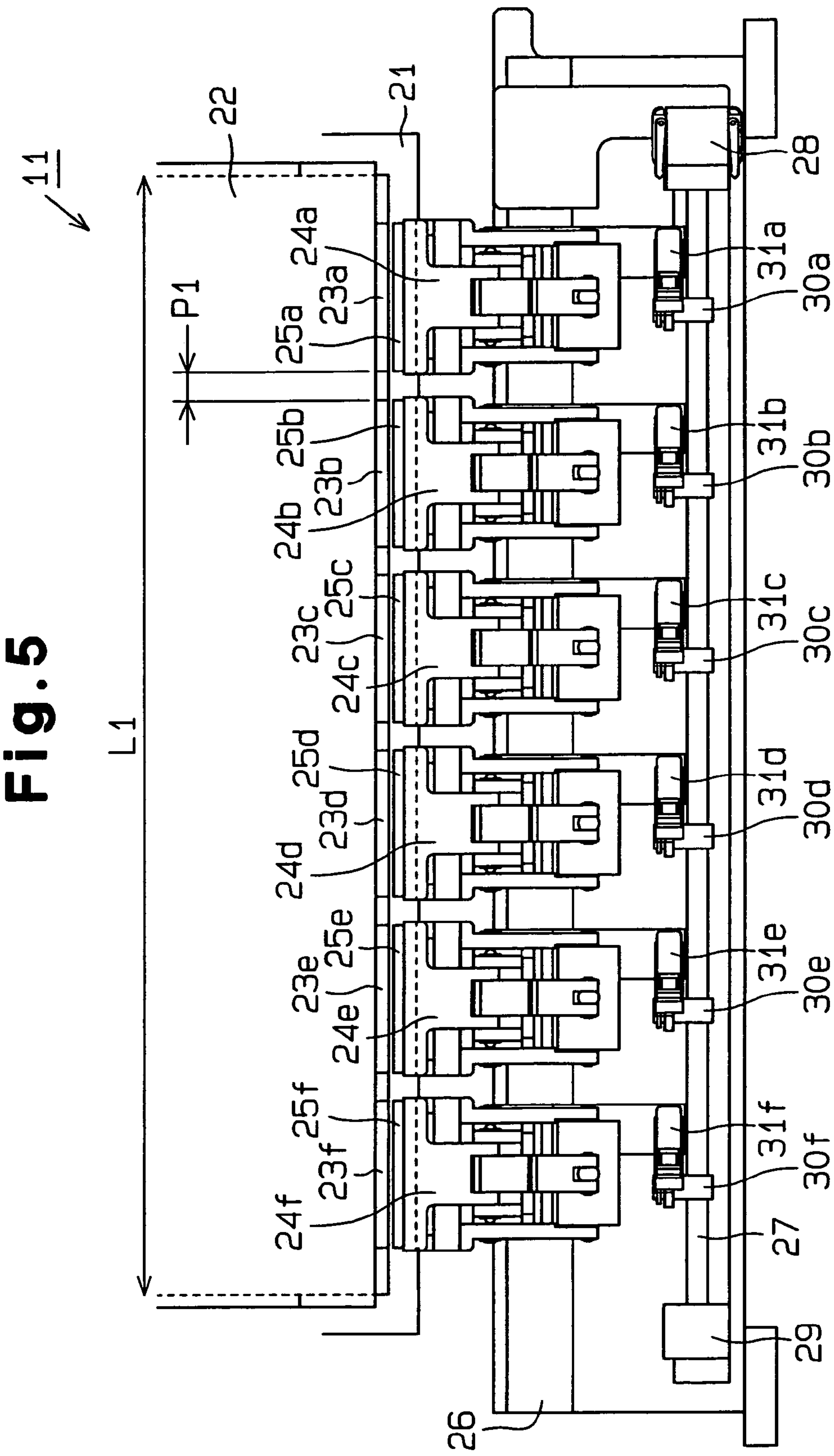
FIG. 5 is a plan view showing the panel inspection apparatus of the present invention positioned to correspond to a relatively large panel.

FIG. 5 shows the display panel 22, which is relatively large. The dimension (length, width, or height) of one side of the display panel 22 is L1. The PDP electrode groups 23*a*–23*f* are separated from each other by interval P1.

The jig 27 is prepared with the connection blocks 30*a*–30*f* arranged in correspondence with the PDP electrode groups 23*a*–23*f* and the interval P1. The connection blocks 30*a*–30*f* position the inspection units 24*a*–24*f* in correspondence with the PDP electrode groups 23*a*–23*f* and the interval P1.

Figure 6:
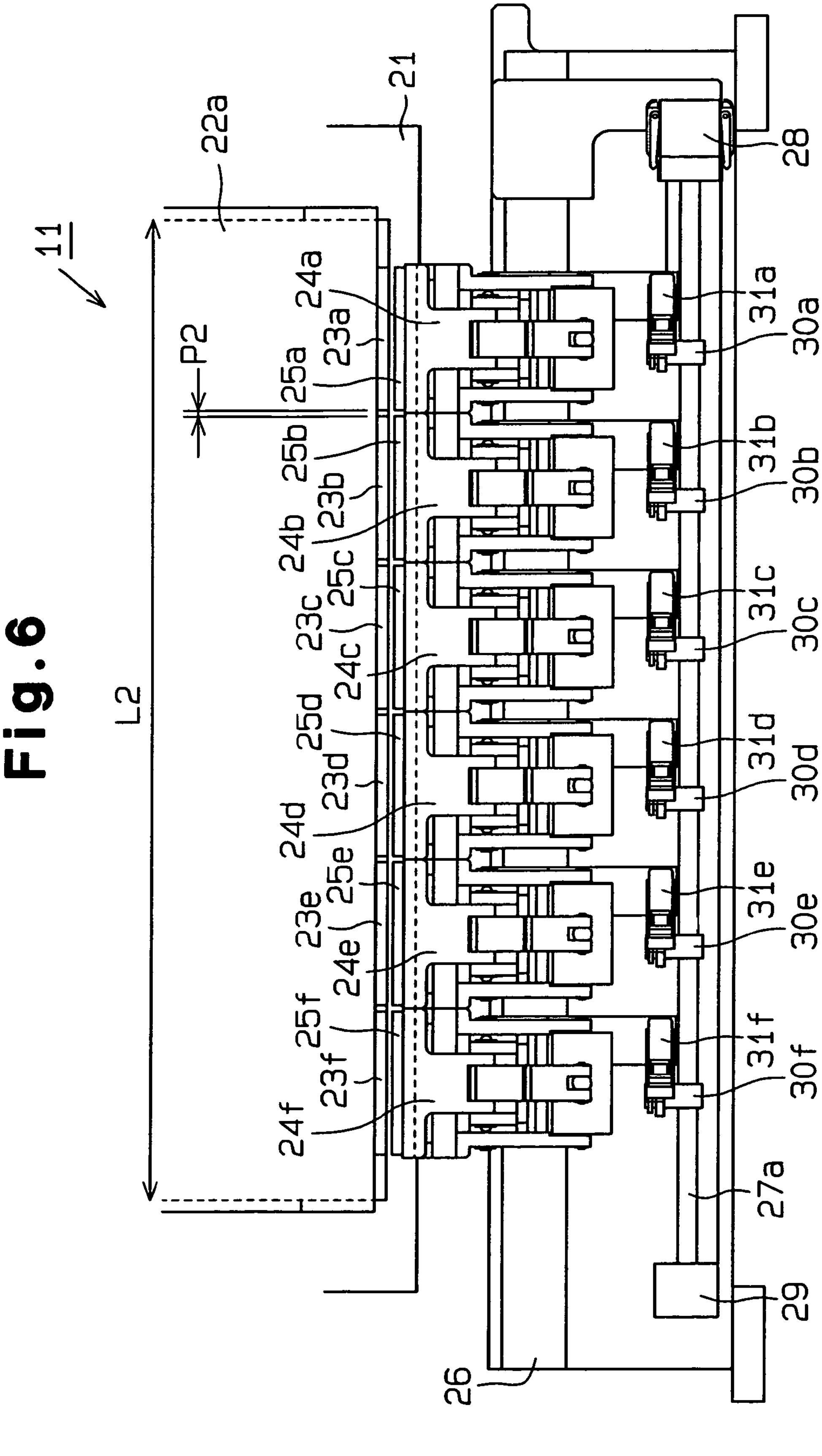
FIG. 6 is a plan view showing the panel inspection apparatus of the present invention positioned to correspond to a middle-size panel.

FIG. 6 shows the display panel 22*a*, which is middle size. The dimension (length, width, or height) of one side of the display panel 22*a* is L2, which is less than L1. The PDP electrode groups 23*a*–23*f* are separated from each other by interval P2 (P2<P1).

The jig 27 of FIG. 5 is exchanged by a jig 27*a*. The connection blocks 30*a*–30*f* are arranged on the jig 27*a* in correspondence with the PDP electrode groups 23*a*–23*f* and the interval P2 of the middle-size display panel 22*a*. The interval (P2) between the connection blocks 30*a*–30*f* of the jig 27*a* is less than the interval (P1) between the connection blocks 30*a*–30*f* of the jig 27.

The inspection units 24*a*–24*f* are respectively connected to the connection blocks 30*a*–30*f* of the exchanged jig 27*a*. Thus, the inspection units 24*a*–24*f* are arranged in correspondence with the PDP electrode groups 23*a*–23*f* and the interval P2.

Figure 7:
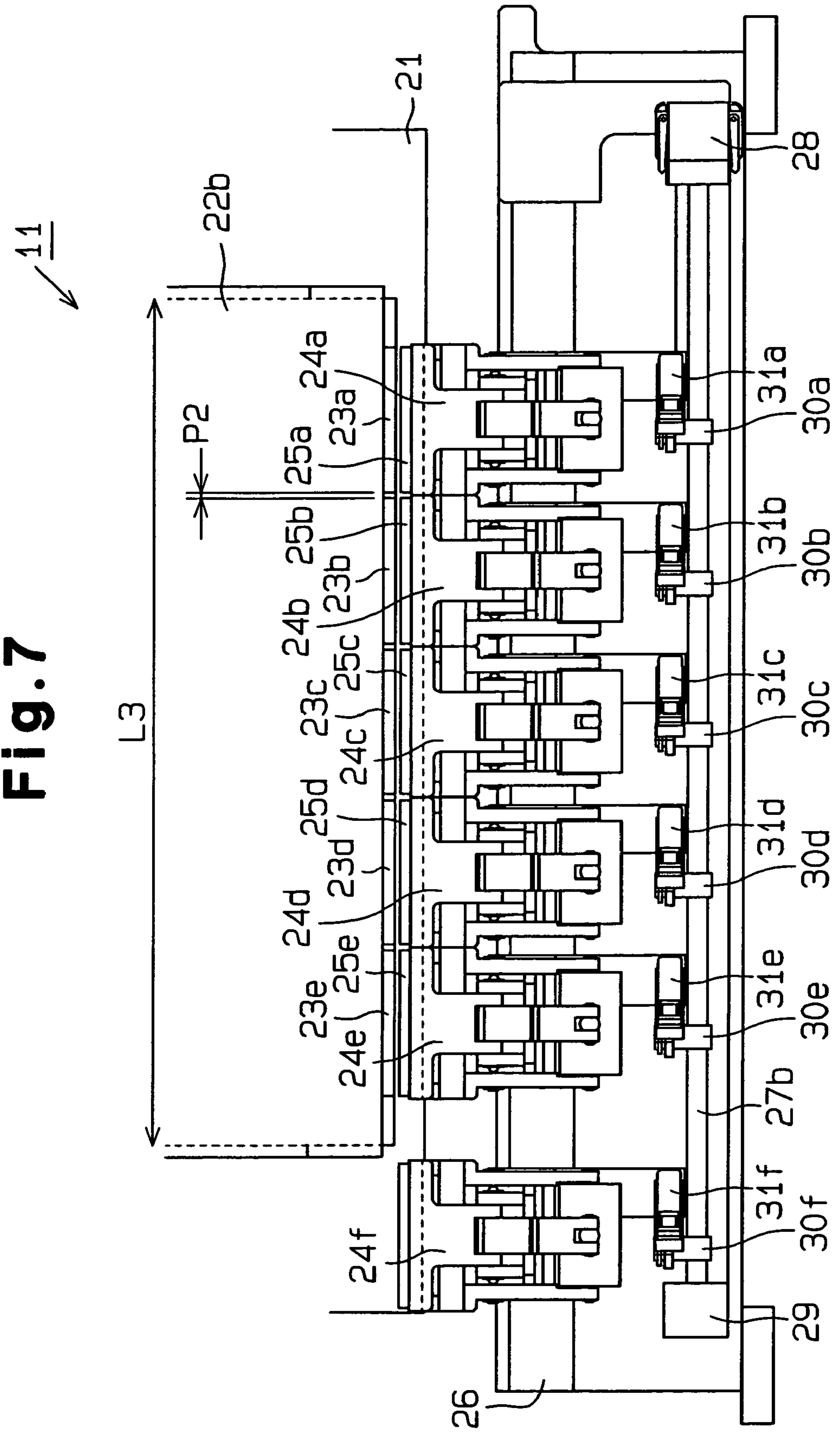
FIG. 7 is a plan view showing the panel inspection apparatus of the present invention positioned to correspond to a relatively small panel.

FIG. 7 shows the display panel 22*b*, which is relatively small. The dimension (length, width, or height) of one side of the display panel 22*a* is L3 (L3<L2<L1). The small display panel 22*b* has five PDP electrode groups 23*a*–23*e*, which are separated from each other by interval P2 (P2<P1).

The jig 27*a* of FIG. 6 is exchanged by a jig 27*b*. The connection blocks 30*a*–30*e* are arranged on the jig 27*b* in correspondence with the PDP electrode groups 23*a*–23*e* and the interval P2 of the small display panel 22*b*. The jig 27*b* includes the connection blocks 30*a*–30*e*, which are arranged in correspondence with the PDP electrode groups 23*a*–23*e*, and the surplus connection block 30*f*. The surplus connection block 30*f* is fixed at a position separated from the connection blocks 30*a*–30*e*. The electrode group interval P2 of the small-size panel 22*b* is the same as that of the middle size panel 22*a*. Thus, the interval (P2) between the connection blocks 30*a*–30*e* of the jig 27*b* is the same as the interval between the connection blocks 30*a*–30*f* of the jig 27*a*.

As shown in FIG. 7, the inspection units 24*a*–24*e* are connected to the connection blocks 30*a*–30*e* and aligned with the five PDP electrode groups 23*a*–23*e* of the small-size panel 22*b*. The inspection unit 24*f* is connected to the connection block 30*f* and moved to a position where it does not interfere with the small-size panel 22*b*. In this case, the connection block 30*f* may be removed from the jig 27*b*. In this manner, the inspection units 24*a*–24*f* are positioned to correspond with the display panels 22, 22*a*, 22*b*, the sizes of which differ from one another.

The inspection unit 24*a* will now be described with reference to FIGS. 8 to 10. The inspection units 24*b*–24*f* are identical to the inspection unit 24*a*.

Figure 8:
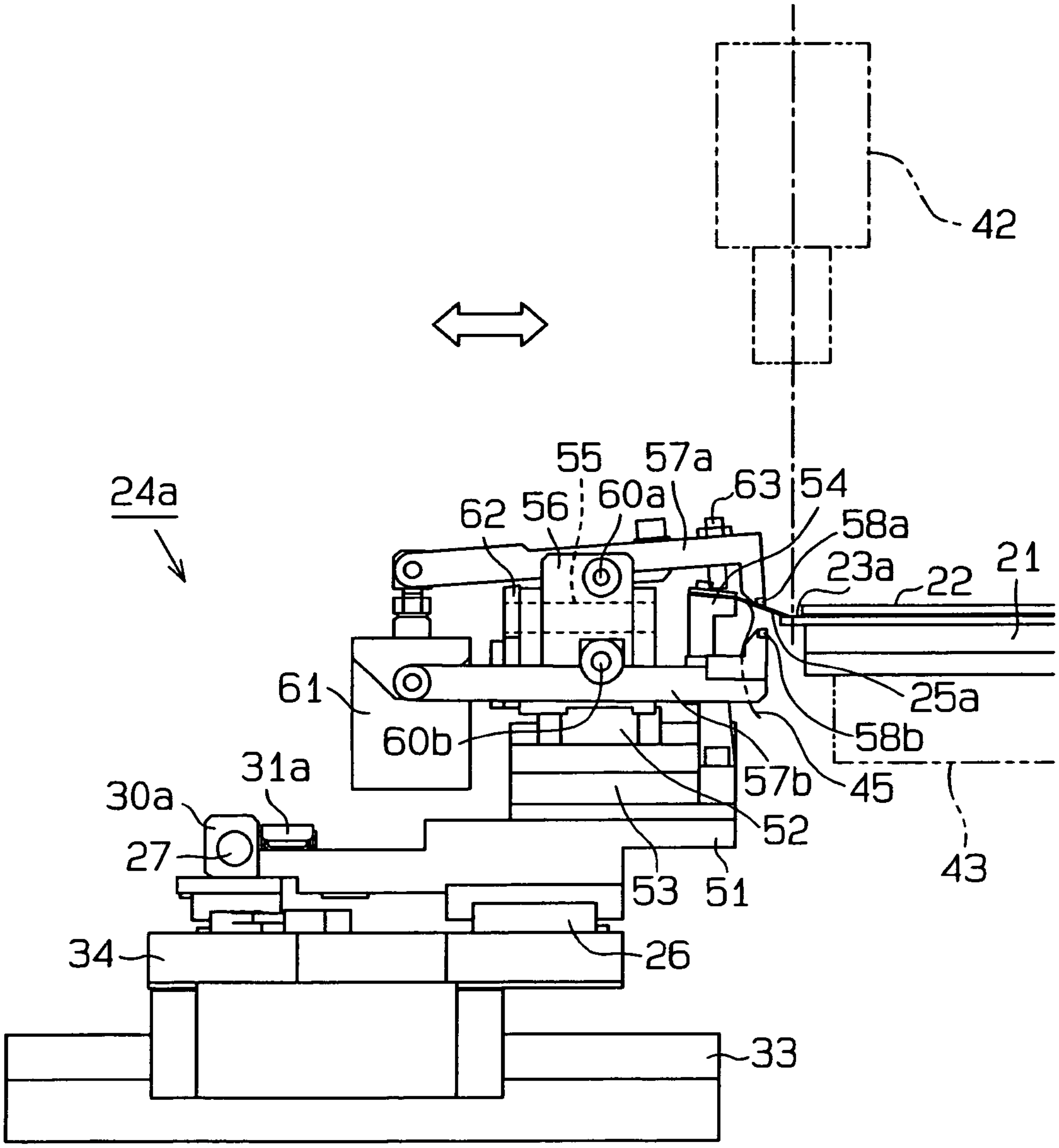
FIG. 8 is a side view showing an inspection unit of the present invention in a state in which pressurizing levers are located at a rear position.

As shown in FIG. 8, the panel inspection apparatus 11 has a camera 42, which serves as a position measurement element. The camera 42 measures the overlapped degree of the inspection electrode 25*a* and the PDP electrode group 23*a*.

Figure 9:
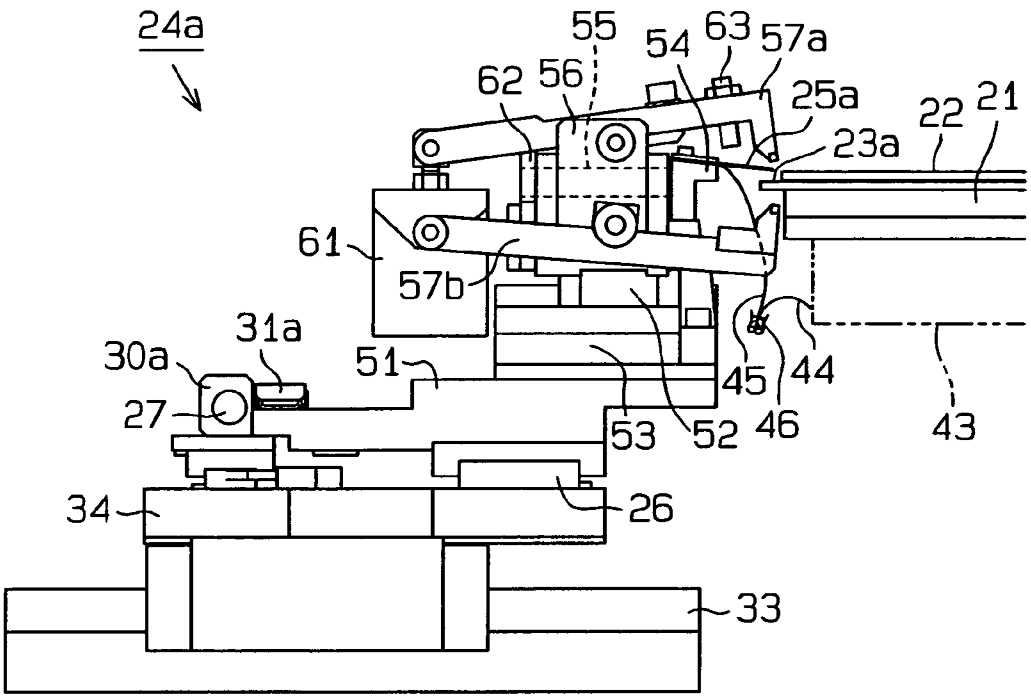
FIG. 9 is a side view showing the same inspection unit in a state in which the pressurizing levers are located at a front position.
Figure 10:
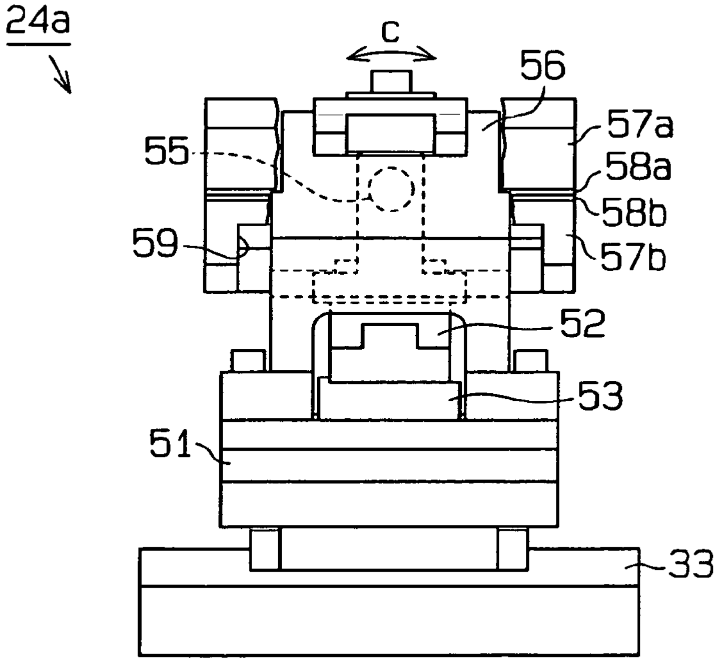
FIG. 10 is a front view showing the same inspection unit.

As shown in FIG. 9, the drive circuit 43, which provides the display panel 22 with the inspection signal, is located under the stage 21. The drive circuit 43 includes a printed circuit film 44 to electrically connect the PDP electrode group 23*a* and the inspection electrode 25*a*. The printed circuit film 44 is long enough to connect the display panel 22 and the drive circuit 43.

The inspection unit 24*a* has a relay flexible printed circuit film 45, which relays the inspection electrode 25*a* and the printed circuit film 44. The relay printed circuit film 45 is connected to the inspection electrode 25*a*. A relay clip 46 connects the relay printed circuit film 45 and the printed circuit film 44. It is preferred that the relay clip 46 be an elastic insulative body. The inspection signal is provided to the display panel 22 from the drive circuit 43 via the printed circuit film 44, the relay printed circuit film 45, the inspection electrode 25*a*, and the PDP electrode group 23*a*.

The inspection unit 24*a* has a support 51, which moves along the first rail 26 parallel to the side of the display panel 22. The catch clip 31*a* connects the support 51 to the connection block 30*a*. A slider 52, which moves perpendicular to the first rail 26, a drive cylinder 53, which drives the slider 52, and a fastening block 54, which is fastened with the inspection electrode 25*a* and the relay printed circuit film 45, are arranged on the support 51. As shown in FIGS. 8 and 9, the upper surface of the fastening block 54 is inclined toward the corresponding side of the display panel 22. Accordingly, the inspection electrode 25*a* is fastened to the fastening block 54 in a state inclined with respect to a horizontal plane by a predetermined angle.

The slider 52 supports a pivot shaft 55 in a manner prohibiting rotation of the pivot shaft 55. The pivot shaft 55 pivotally supports a fulcrum block 56 so that the fulcrum block 56 is pivotal in the directions indicated by arrow C in FIG. 10. The fulcrum block 56 is provided with an upper pressurizing lever 57*a*, which applies force to the upper surface of the inspection electrode 25*a*, and a lower pressurizing lever 57*b*, which applies force to the lower surface of the inspection electrode 25*a*. Elastic bodies 58*a*, 58*b* are respectively attached to the distal ends of the pressurizing levers 57*a*, 57*b*. Referring to FIG. 10, a relay passage 59, which enables the passage of the relay printed circuit film 45, is formed by cutting out the distal end of the lower pressurizing lever 57*b*.

As shown in FIG. 8, the basal ends of the upper and lower pressurizing levers 57*a*, 57*b* are connected to a pressurizing cylinder 61. The upper pressurizing lever 57*a* is pivotally supported about an upper pivot shaft 60*a*, and the lower pressurizing lever 57*b* is pivotally supported about a lower pivot shaft 60*b*. The upper pressurizing lever 57*a*, the lower pressurizing lever 57*b*, and the pressurizing cylinder 61 form a parallel link mechanism.

The pressurizing cylinder 61 pivots the pressurizing levers 57*a*, 57*b*. More specifically, the pressurizing levers 57*a*, 57*b* are respectively pivoted toward the upper and lower surfaces of the inspection electrode 25*a* when a piston projects from the pressurizing cylinder 61 and moves the basal ends of the pressurizing levers 57*a*, 57*b* away from each other. On the other hand, the pressurizing levers 57*a*, 57*b* are respectively pivoted away from the upper and lower surfaces of the inspection electrode 25*a* when the piston retracts into the pressurizing cylinder 61 and moves the basal ends of the pressurizing levers 57*a*, 57*b* toward each other. The distance between the pressurizing levers 57*a*, 57*b* varies in accordance with the distance the piston is projected from pressurizing cylinder 61. That is, the pressure applied between the pressurizing levers 57*a*, 57*b* is adjusted in accordance with the piston projection distance of the pressurizing cylinder 61.

A pivot restriction plate 62, which servers as a pivot restricting element, is arranged between the fulcrum block 56 and the pressurizing cylinder 61 to restrict the pivoting of the fulcrum block 56. The pivot restriction plate 62 restricts the pivotal movement of the fulcrum block 56 in the directions indicated by arrow C in FIG. 10 when the pressurizing cylinder 61 moves the pressurizing levers 57*a*, 57*b* away from the inspection electrodes 25*a*.

More specifically, the pressurizing levers 57*a*, 57*b* pivot away from the inspection electrode 25*a* and abut against the pivot restriction plate 62 to restrict the pivotal movement of the fulcrum block 56. On the other hand, the pressurizing levers 57*a*, 57*b* pivot toward the inspection electrode 25*a* and move away from the pivot restriction plate 62 to allow the pivotal movement of the fulcrum block 56. In this state, the fulcrum block 56 and the pressurizing levers 57*a*, 57*b* are pivotal in the directions indicated by arrow C in FIG. 10.

The pivot restriction plate 62 prevents the distal ends of the pressurizing levers 57*a*, 57*b* from damaging the panel 22 when the pressurizing levers 57*a*, 57*b* are separated from the inspection electrode 25*a*. On the other hand, the fulcrum block 56 is pivotal when the pressurizing levers 57*a*, 57*b* are pivoted to apply force to the inspection electrode 25*a*. This enables the levers 57*a*, 57*b* to follow the bending of the panel 22.

The upper pressurizing lever 57*a* is provided with a stopper bolt 63, which serves as a pivoting amount adjusting element. As shown in FIG. 8, the stopper bolt 63 abuts against the upper portion of the fastening block 54 to restrict the downward pivotal movement of the upper pressurizing lever 57*a*. This determines the amount the pressurizing lever 57*a* lowers the inspection electrode 25*a*.

The operation of the inspection unit 24*a* will now be discussed.

The catch clip 31*a* connects the inspection unit 24*a* to the jig 27. This substantially determines the position of the inspection electrode 25*a* in the lateral direction, which is indicated by arrow A. The inspection unit 24*a* is then moved along the second rail 33 toward the right as viewed in FIG. 8 to arrange the inspection electrode 25*a* above the PDP electrode group 23*a*. The drive cylinder 53 then moves the slider 52 to the left as viewed in FIG. 8. This moves the pressurizing levers 57*a*, 57*b* away from the display panel 22. However, the fastening block 54 keeps the inspection electrode 25*a* arranged above the PDP electrode group 23*a*.

Referring to FIG. 8, the pressurizing cylinder 61 pivots the upper pressurizing lever 57*a* downward and lowers the generally middle portion of the inspection electrode 25*a*. An inspector contacts the inspection electrode 25*a* with the PDP electrode group 23*a* while visually confirming the distal end of the inspection electrode 25*a*.

Contact between the fastening block 54 and the stopper bolt 63 is adjusted to vary the lowered amount of the inspection electrode 25*a*. That is, the stopper bolt 63 is adjusted to set the force applied by the upper pressurizing lever 57*a* so that the distal end of the inspection electrode 25*a* contacts the PDP electrode group 23*a*. This prevents the upper pressurizing lever 57*a* from damaging the inspection electrode 25*a*.

The camera 42 detects the inspection electrode 25*a* and the PDP electrode group 23*a* to check the overlapping degree of the inspection electrode 25*a* and the PDP electrode group 23*a*. When the inspection electrode 25*a* and the PDP electrode group 23*a* do not overlap each other, the inspector corrects the position of the inspection electrode 25*a*.

After completing the positioning of the inspection electrode 25*a*, the drive cylinder 53 moves the slider 52 to the right as viewed in FIG. 8. This moves the pressurizing levers 57*a*, 57*b* toward the display panel 22 until the distal ends of the pressurizing levers 57*a*, 57*b* reach the vicinity of the inspection electrode 25*a*.

The pressurizing cylinder 61 pivots the pressurizing levers 57*a*, 57*b* so that the display panel 22 and the inspection electrode 25*a* are clamped between the elastic bodes 58*a*, 58*b* of the pressurizing levers 57*a*, 57*b*. In this manner, the inspection unit 24*a* accurately contacts the inspection electrode 25*a* with the PDP electrode group 23*a*.

Figure 11A:
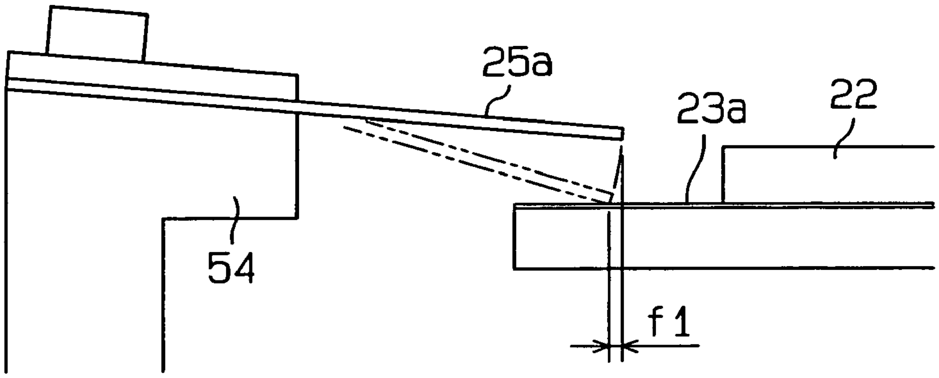
FIG. 11A is a side view showing a fastening block of the preferred embodiment which has an inclined upper surface.
Figure 11B:
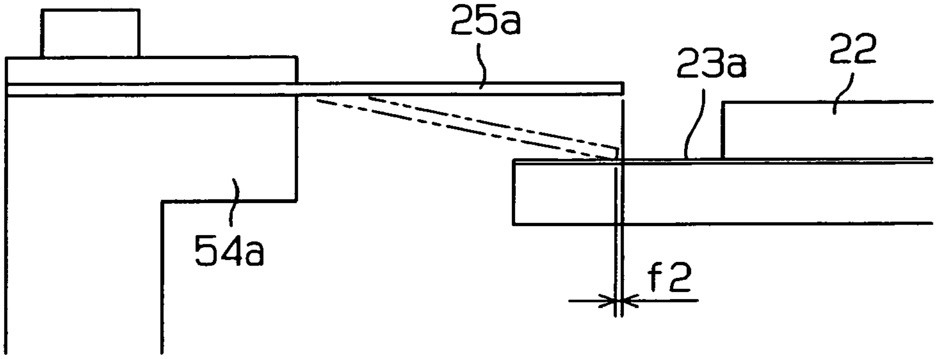
Fig.11B (Prior Art)
FIG. 11B is a side view showing a prior art fastening block having a generally horizontal upper surface.

FIG. 11A is a side view showing the fastening block 54 in the preferred embodiment. FIG. 11B is a side view showing a prior art fastening block 54*a*.

The fastening block 54 of the preferred embodiment has an inclined upper surface. Thus, the inspection electrode 25*a*, which is fastened to the fastening block 54, is inclined relative to a horizontal plane by a predetermined angle. The prior art fastening block 54*a* of FIG. 11B has a generally horizontal upper surface. Thus, the inspection electrode 25*a*, which is fastened to the fastening block 54*a*, extends horizontally.

The broken lines in FIGS. 11A and 11B show the state of the inspection electrodes 25*a* when they are lowered by the same distance so that they contact the corresponding PDP electrode groups 23*a*. In the preferred embodiment, the lowering of the inspection electrode 25*a* horizontally displaces the distal end of the inspection electrode 25*a* by distance f1. In the prior art, the lowering of the inspection electrode 25*a* horizontally displaces the distal end of the inspection electrode 25*a* by distance f2. Distance f1 is greater than distance f2.

Generally, metal such as chromium (Cr) is deposited on the surface of the glass display panel 22 to form the PDP electrode group 23*a*. An oxidation film normally forms on the surface of the display panel 22 when the display panel 22 is exposed to the atmosphere. The oxidation film is normally insulative. This interferes with the electric connection between the inspection electrode 25*a* and the PDP electrode group 23*a*. It is thus preferred that the oxidation film be removed.

In the preferred embodiment, the distal end of the electrode 25*a* is horizontally displaced when the inspection electrode 25*a* is lowered. The distal end of the electrode 25*a* moves horizontally by a distance that is greater than that in the prior art. Thus, the distal end of the electrode 25*a* effectively wipes off the oxidation film from the surface of the PDP electrode group 23*a*. This enhances the electric connection between the inspection electrode 25*a* and the PDP electrode group 23*a*.

The operation of the inspection unit 24*a* when the display panel 22 is deformed (expanded, contracted, or bent) will now be discussed with reference to FIG. 12.

Figure 12:
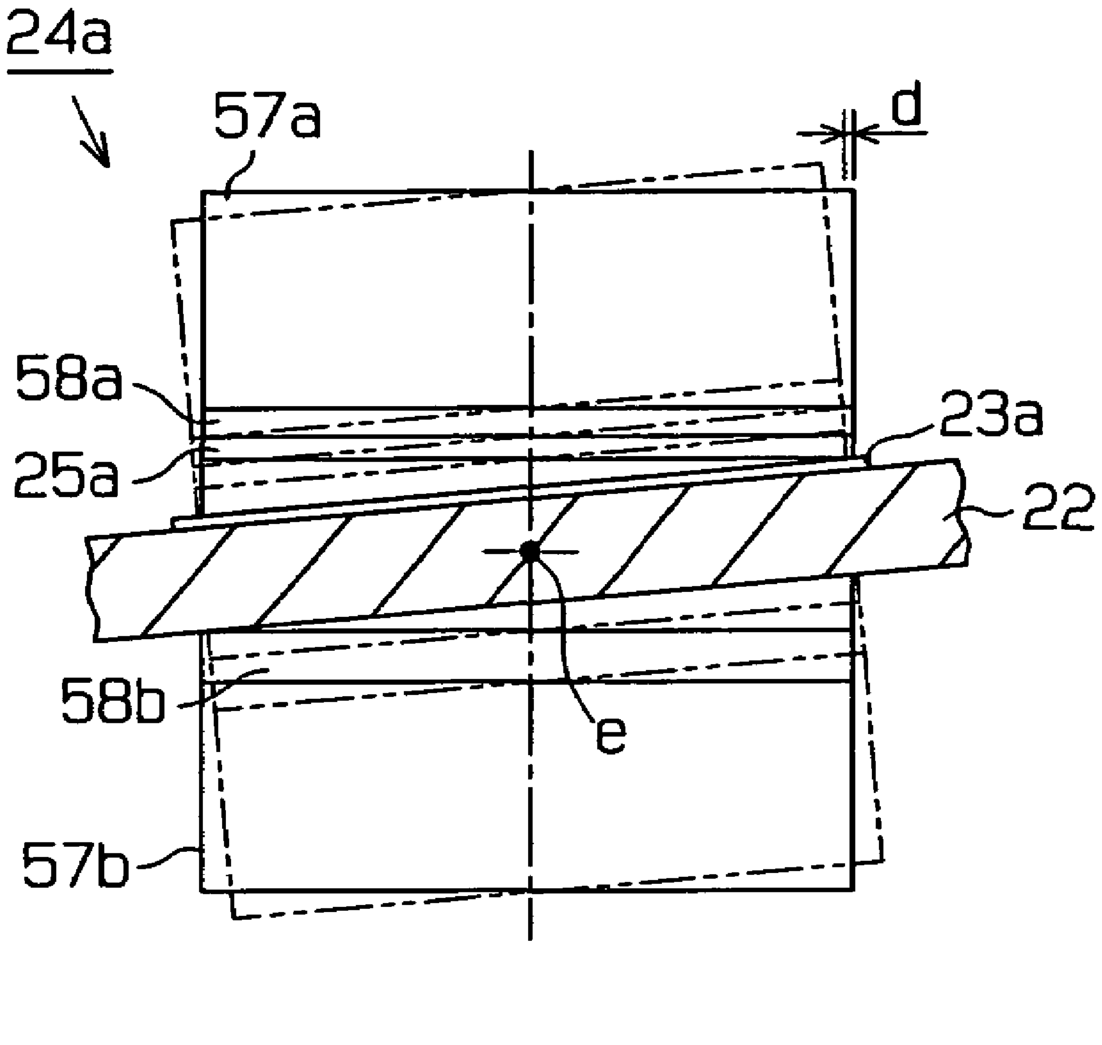
FIG. 12 is a cross-sectional view showing pressurizing levers of the present invention arranged along a deformed display panel.

When the display panel 22 is bent, the parallel link mechanism, which includes the pressurizing cylinder 61, pivots the pressurizing levers 57*a*, 57*b* about pivot axis e (i.e., the axis of the pivot shaft 55 in the fulcrum block 56), which is shown in FIG. 12. The broken lines of FIG. 12 show the pressurizing levers 57*a*, 57*b* in a pivoted state. Accordingly, the pressurizing levers 57*a*, 57*b* follow the deformation of the panel 22. Further, the inspection electrode 25*a* uniformly contacts the PDP electrode group 23*a*.

When the pivoting of the pressurizing levers 57*a*, 57*b* is completed, the inspection electrode 25*a* is offset from the PDP electrode group 23*a* by a slight offset amount d. In this state, the inspection electrode 25*a* is in contact with the elastic body 58*a* of the upper pressurizing lever 57*a*. However, the elastic body 58*a* absorbs the slight offset amount d. Thus, the contact between the inspection electrode 25*a* and the PDP electrode group 23*a* is accurate.

The panel inspection apparatus 11 includes a controller (not shown), which is provided with an operation panel. The controller controls the inspection units 24*a*–24*f*. The inspector uses the operation panel to move the inspection units 24*a*–24*f* and the inspection electrodes 25*a*–25*f*.

The controller, for example, controls a plurality of valves connected to the drive cylinder 53 and the pressurizing cylinder 61 of the inspection unit 24*a* shown in FIG. 8. The controller operates the valves and switches the flow direction of the air supplied to the cylinders 53, 61. In this manner, the controller controls the movement of the inspection unit 24*a* and the pivoting of the upper and lower pressurizing levers 57*a*, 57*b*.

Further, the controller operates a plurality of valves connected to a cylinder that moves the base 34 and switches the flow direction of the air supplied to the cylinder. This moves the base 34 so that the inspection units 24*a*–24*f* are arranged at an inspection position located near the display panel 22 or a non-inspection position separated from the display panel 22.

The controller also drives the alignment motor 38 when the operation panel is manipulated. This moves the slide block 37 along the side of the display panel 22.

The panel inspection apparatus 11 of the preferred embodiment has the advantages described below.

(1) The inspection electrode 25*a* is fastened to the fastening block 54. The fastening block 54 moves to a position where the inspection electrode 25*a* contacts the PDP electrode group 23*a*. The upper and lower pressurizing levers 57*a*, 57*b*, which are movable independently from the fastening block 54, are separated from the display panel 22. This enables the inspection electrode 25*a* and the PDP electrode group 23*a* to be aligned while visually confirming the overlapped degree of the inspection electrode 25*a* and the PDP electrode group 23*a*. As a result, the inspection electrode 25*a* accurately contacts the PDP electrode group 23*a* and improves the panel inspection accuracy.

(2) The parallel link mechanism, which is formed by the pressurizing levers 57*a*, 57*b* and the pressurizing cylinder 61, enables the pressurizing levers 57*a*, 57*b* to move and follow the displacement (i.e., bending) of the display panel 22 in a direction perpendicular to the plane of the panel 22. Further, the fulcrum block 56 is pivotal about the pivot shaft 55. Thus, the pressurizing levers 57*a*, 57*b* move to follow the bending or undulating deformation of the panel 22. Accordingly, even if the display panel is deformed (expanded, contracted, or bent), the inspection electrode 25*a* contacts the PDP electrode group 23*a* with high accuracy.

(3) The fastening block 54 holds the inspection electrode 25*a* in a state inclined toward the display panel 22. Thus, the inspection electrode 25*a* comes into contact with the PDP electrode group 23*a* while wiping off oxidation films from the surface of the PDP electrode group 23*a*. This improves the electric connection between the inspection electrode 25*a* and the PDP electrode group 23*a*.

(4) The jig 27 includes the connection blocks 30*a*–30*f*, which are arranged in correspondence with the width of and pitch between the electrode groups 23*a*–23*f* and the electrode group interval P1. The inspection units 24*a*–24*f* are respectively connected to the connection blocks 30*a*–30*f*. Thus, the inspection units 24*a*–24*f* are aligned with the PDP electrode groups 23*a*–23*f*, which are formed on one side of the display panel 22.

Further, multiple types of the jig 27 is prepared for the panels 22, 22*a*, 22*b*, which have different sizes. The jig 27 corresponding to the size of the panel 22, 22*a*, 22*b* that is to undergo inspection is selected. This facilitates the positioning of the inspection units 24*a*–24*f*. Accordingly, the panel inspection apparatus 11 facilitates the inspection of the panels 22, 22*a*, 22*b*, which have different sizes.

(5) The relay passage 59 is formed by cutting out the distal end of the lower pressurizing lever 57*a*. The relay printed circuit film 45, which electrically connects the inspection electrode 25*a* and the drive circuit 43, extends through the relay passage 59 and connects with the printed circuit film 44 of the drive circuit 43. The relay printed circuit film 45 and the printed circuit film 44 are not pressed by the pressurizing levers 57*a*, 57*b*. This prevents the inspection electrode from being damaged. Thus, the life of the inspection electrode 25*a* is prolonged and the running cost of the panel inspection apparatus 11 is reduced.

The panel inspection apparatus 11 of the preferred embodiment may be modified as described below.

The relay printed circuit film 45 and the inspection electrode 25*a* may be integrally formed. Alternatively, they may be formed separately.

The number of the PDP electrode groups 23*a*–23*f* formed on one side of the display panel 22 may be five or less or seven or more.

Air pipes and wires for connecting the controller (not shown) and the inspection units 24*a*–24*f* may be arranged in the jig 27. This facilitates the connection and disconnection of the air pipes and wires when removing the inspection units 24*a*–24*f*.

The fine adjustment screws 32*a*–32*f* may be eliminated, and the inspection units 24*a*–24*f* may include drive mechanisms so that they are moved along the side edge of the panel 22.

It should be apparent to those skilled in the art that the present invention may be embodied in many other specific forms without departing from the spirit or scope of the invention. Therefore, the present embodiment is to be considered as illustrative and not restrictive, and the invention is not to be limited to the details given herein, but may be modified within the scope and equivalence of the appended claims.

What is claimed is:

1. A panel inspection apparatus for inspecting a display panel, wherein the display panel has a side on which a panel electrode group is arranged, the panel inspection apparatus comprising:

an inspection unit including an inspection electrode, wherein the inspection unit causes the inspection electrode to contact the panel electrode group and moves in a direction perpendicular to the side of the display panel; and a pressurizing mechanism for pressing the inspection electrode against the panel electrode group, wherein the pressurizing mechanism moves independently in a direction perpendicular to the side of the display panel in a state in which the inspection unit is arranged at a position where the inspection electrode contacts the panel electrode group, wherein the pressurizing mechanism includes a pair of pivotally movable pressurizing levers, wherein the pair of pivotally movable pressurizing levers cause the inspection electrode to contact the panel electrode group with a predetermined force, wherein the pressurizing levers move toward the display panel in a first direction that is perpendicular to the one side of the display panel and moves away from the display panel in a second direction that is opposite the first direction, and wherein the inspection electrode is arranged at a position near the panel electrode group where the inspection electrode is visual when the pressurizing levers are separated from the side of the display panel.

2. The panel inspection apparatus according to claim 1, wherein the inspection electrode is inclined toward the display panel by a predetermined angle.

3. The panel inspection apparatus according to claim 1, further comprising:

a positioning device connected to the inspection unit; and a jig for supporting the positioning device, wherein the positioning device is secured to the jig in correspondence with the panel electrode group.

4. The panel inspection apparatus according to claim 3, wherein the panel electrode group is one of a plurality of panel electrode groups formed in accordance with the dimension of the display panel, the panel electrode groups being spaced from one another by a predetermined pitch, wherein the positioning device is one of a plurality of positioning devices provided in correspondence with the panel electrode groups, the positioning devices being secured to the jig spaced from one another by the predetermined pitch.

5. A panel inspection apparatus for inspecting a display panel, wherein the display panel has a side on which a panel electrode group is arranged, the panel inspection apparatus comprising:

an inspection unit including an inspection electrode, wherein the inspection unit causes the inspection electrode to contact the panel electrode group and moves in a direction perpendicular to the side of the display panel;

a pressurizing mechanism for pressing the inspection electrode against the panel electrode group, wherein the pressurizing mechanism moves independently in a direction perpendicular to the side of the display panel in a state in which the inspection unit is arranged at a position where the inspection electrode contacts the panel electrode group, wherein the pressurizing mechanism includes a pair of pivotally movable pressurizing levers further comprising: a positioning device connected to the inspection unit; and a jig for supporting the positioning device, wherein the positioning device is secured to the jig in correspondence with the panel electrode group;

wherein the panel electrode group is one of a plurality of panel electrode groups formed in accordance with the dimension of the display panel, the panel electrode groups being spaced from one another by a predetermined pitch, wherein the positioning device is one of a plurality of positioning devices provided in correspondence with the panel electrode groups, the positioning devices being secured to the up spaced from one another by the predetermined pitch; and wherein the jig includes a surplus positioning device separated from the positioning devices corresponding to the panel electrode groups.

6. The panel inspection apparatus according to claim 3, wherein the display panel is either one of a first display panel having a first size and including a plurality of first panel electrode groups or a second display panel having a second size differing from the first size and including a plurality of second panel electrode groups, wherein the jig is either one of a first jig adapted to the first display panel or a second jig adapted to the second display panel, the first jig including a plurality of first positioning devices prearranged at positions corresponding to the plurality of first panel electrode groups, and the second jig including a plurality of second positioning devices prearranged at positions corresponding to the second panel electrode groups.

7. The panel inspection apparatus according to claim 3, further comprising:

an adjusting element arranged on the positioning device, wherein the adjusting element finely adjusts the position of the inspection unit by moving the inspection unit along the side of the display panel.

8. The panel inspection apparatus according to claim 1, further comprising:

a drive circuit for providing the display panel with an inspection signal;

a relay printed circuit connected to the inspection electrode to electrically connect the inspection electrode and the drive circuit; and a connector connecting the relay printed circuit and the drive circuit, wherein the connector disconnects the relay printed circuit and the drive circuit when the inspection electrode is separated from the panel electrode group.

9. The panel inspection apparatus according to claim 8, wherein a passage enabling passage of the relay printed circuit is formed on one of the two pressurizing levers.

10. A panel inspection apparatus for inspecting a display panel, wherein the display panel has a side on which a panel electrode group is arranged, the panel inspection apparatus comprising:

an inspection unit including an inspection electrode, wherein the inspection unit causes the inspection electrode to contact the panel electrode group and moves in a direction perpendicular to the side of the display panel;

a pressurizing mechanism for pressing the inspection electrode against the panel electrode group, wherein the pressurizing mechanism moves independently in a direction perpendicular to the side of the display panel in a state in which the inspection unit is arranged at a position where the inspection electrode contacts the panel electrode group, wherein the pressurizing mechanism includes a pair of pivotally movable pressurizing levers further comprising:

a drive circuit for providing the display panel with an inspection signal;

a relay printed circuit connected to the inspection electrode to electrically connect the inspection electrode and the drive circuit; and a connector connecting the relay printed circuit and the drive circuit, wherein the connector disconnects the relay printed circuit and the drive circuit when the inspection electrode is separated from the panel electrode group, wherein a passage enabling passage of the relay printed circuit is formed on one of the two pressurizing levers, wherein the two pressurizing levers includes an upper pressurizing lever and a lower pressurizing lever pivoted to apply force to an upper surface and a lower surface of the inspection electrode, and wherein the inspection unit further includes a pivoting amount adjusting element for adjusting a pivoting amount of the upper pressurizing lever.

11. The panel inspection apparatus according to claim 10, wherein the pivoting amount adjusting element adjusts the pivoting amount of the upper pressurizing lever so that a distal end of the inspection electrode contacts the panel electrode group.

12. A panel inspection apparatus for inspecting a display panel, wherein the display panel has a side on which a panel electrode group is arranged, the panel inspection apparatus comprising:

an inspection unit including an inspection electrode, wherein the inspection unit causes the inspection electrode to contact the panel electrode group and moves in a direction perpendicular to the side of the display panel;

a pressurizing mechanism for pressing the inspection electrode against the panel electrode group, wherein the pressurizing mechanism moves independently in a direction perpendicular to the side of the display panel in a state in which the inspection unit is arranged at a position where the inspection electrode contacts the panel electrode group, wherein the pressurizing mechanism includes a pair of pivotally movable pressurizing levers further comprising:

a drive circuit for providing the display panel with an inspection signal;

a relay printed circuit connected to the inspection electrode to electrically connect the inspection electrode and the drive circuit;

a connector connecting the relay printed circuit and the drive circuit, wherein the connector disconnects the relay printed circuit and the drive circuit when the inspection electrode is separated from the panel electrode group, wherein a passage enabling passage of the relay printed circuit is formed on one of the two pressurizing levers, further comprising:

a pivot shaft extending perpendicular to the one side of the display panel; and a fulcrum block pivotally supported by the pivot shaft and pivotally supporting the two pressurizing levers.

13. The panel inspection apparatus according to claim 12, further comprising:

a pivot restricting element for restricting the pivoting of the fulcrum block when the two pressurizing levers pivot away from the inspection electrode and contact the pivot restricting element.

14. A panel inspection apparatus for inspecting a display panel, wherein the display panel has a side on which a plurality of panel electrode groups are arranged, the panel inspection apparatus comprising:

a plurality of inspection units including inspection electrodes, wherein the inspection unit causes the inspection electrode to contact the panel electrode group and moves in a direction perpendicular to the side of the display panel; and a plurality of pressurizing mechanisms for pressing the inspection electrodes against the panel electrode group, wherein the pressurizing mechanism moves independently in a direction perpendicular to the side of the display panel in a state in which the inspection unit is arranged at a position where the inspection electrode contacts the panel electrode group, wherein the pressurizing mechanisms each include a pair of pivotally movable pressurizing levers, wherein the pair of pivotally movable pressurizing levers cause the inspection electrode to contact the panel electrode group with a predetermined force, wherein the pressurizing levers move toward the display panel in a first direction that is perpendicular to the one side of the display panel and moves away from the display panel in a second direction that is opposite the first direction, and wherein the inspection electrode is arranged at a position near the panel electrode group where the inspection electrode is visual when the pressurizing levers are separated from the side of the display panel.

15. A panel inspection apparatus for inspecting a display panel, wherein the display panel has a side on which a panel electrode group is arranged, the panel inspection apparatus comprising:

an inspection unit including an inspection electrode, wherein the inspection unit causes the inspection electrode to contact the panel electrode group and moves in a direction perpendicular to the side of the display panel;

a pressurizing mechanism for pressing the inspection electrode against the panel electrode group, wherein the pressurizing mechanism moves independently in a direction perpendicular to the side of the display panel in a state in which the inspection unit is arranged at a position where the inspection electrode contacts the panel electrode group;

a positioning device connected to the inspection unit; and a jig for supporting the positioning device, wherein the positioning device is secured to the jig in correspondence with the panel electrode group, wherein the panel electrode group is one of a plurality of panel electrode groups formed in accordance with the dimension of the display panel, the panel electrode groups being spaced from one another by a predetermined pitch, wherein the positioning device is one of a plurality of positioning devices provided in correspondence with the panel electrode groups, the positioning devices being secured to the jig spaced from one another by the predetermined pitch, and wherein the jig includes a surplus positioning device separated from the positioning devices corresponding to the panel electrode groups.

* * * * *

UNITED STATES PATENT AND TRADEMARK OFFICE

CERTIFICATE OF CORRECTION

PATENT NO. : 6,972,586 B2
APPLICATION NO. : 10/014369
DATED : December 6, 2005
INVENTOR(S) : Akira Sawamori It is certified that error appears in the above-identified patent and that said Letters Patent is hereby corrected as shown below:

Column 11, Line 63, delete “up” and insert -- jig -- therefor.

Signed and Sealed this

Eighteenth Day of July, 2006

JON W. DUDAS
*Director of the United States Patent and Trademark Office*